US009643252B2

(12) United States Patent
Dorn et al.

(10) Patent No.: US 9,643,252 B2
(45) Date of Patent: May 9, 2017

(54) ELECTRICALLY CONTROLLED CATALYTIC NANOWIRE GROWTH BASED ON SURFACE CHARGE DENSITY

(75) Inventors: August Dorn, Cambridge, MA (US); Cliff R. Wong, Cambridge, MA (US); Moungi G. Bawendi, Cambridge, MA (US)

(73) Assignee: MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 650 days.

(21) Appl. No.: 12/628,788

(22) Filed: Dec. 1, 2009

(65) Prior Publication Data
US 2010/0148152 A1 Jun. 17, 2010

Related U.S. Application Data

(60) Provisional application No. 61/119,158, filed on Dec. 2, 2008.

(51) Int. Cl.
| | |
|---|---|
| H01L 29/00 | (2006.01) |
| B22F 9/14 | (2006.01) |
| B22F 1/00 | (2006.01) |
| B22F 1/02 | (2006.01) |
| B82Y 30/00 | (2011.01) |
| H01L 29/06 | (2006.01) |
| H01L 29/02 | (2006.01) |
| H01L 29/04 | (2006.01) |

(52) U.S. Cl.
CPC .............. *B22F 9/14* (2013.01); *B22F 1/0025* (2013.01); *B22F 1/02* (2013.01); *B82Y 30/00* (2013.01); *H01L 29/02* (2013.01); *H01L 29/04* (2013.01); *H01L 29/06* (2013.01)

(58) Field of Classification Search
CPC .......... H01L 29/02; H01L 29/04; H01L 29/06
USPC ........................................................ 438/103
See application file for complete search history.

(56) References Cited

U.S. PATENT DOCUMENTS

| | | | |
|---|---|---|---|
| 6,251,303 B1 | 6/2001 | Bawendi et al. | |
| 6,322,901 B1 * | 11/2001 | Bawendi et al. | ............. 428/548 |
| 6,326,144 B1 | 12/2001 | Bawendi et al. | |
| 6,617,583 B1 | 9/2003 | Bawendi et al. | |
| 6,831,017 B1 * | 12/2004 | Li et al. | .................. 438/694 |
| 7,423,512 B1 * | 9/2008 | Reitz | ..................... B82Y 30/00 |
| | | | 252/301.4 R |
| 2004/0005723 A1 * | 1/2004 | Empedocles et al. | ............. 438/1 |
| 2007/0160747 A1 * | 7/2007 | Mitzi et al. | ..................... 427/74 |
| 2008/0107892 A1 | 5/2008 | Jiao et al. | |

FOREIGN PATENT DOCUMENTS

| | | |
|---|---|---|
| KR | 10-0723384 | 5/2007 |
| KR | 10-2007-0104034 | 10/2007 |

OTHER PUBLICATIONS

Avigal et al., *App. Phys. Lett.* 2001, 78, 2291-2293.
Bulro et al., *Adv. Mater.* 1996, 8, 685.
(Continued)

*Primary Examiner* — Kimberly Rizkallah
*Assistant Examiner* — Alexander Belousov
(74) *Attorney, Agent, or Firm* — Steptoe & Johnson LLP

(57) ABSTRACT

A population of nanowires can be prepared by a method involving electric field catalyzed growth and alteration based on surface charge density.

20 Claims, 9 Drawing Sheets

(56) References Cited

OTHER PUBLICATIONS

Chen et al., *App. Phys. Lett.* 2001, 78, 3714-3716.
Englander et al., *Nano Letters* 2005, 5, 705-708.
Fanfair et al., *Crys. Growth & Des.* 2005, 5, 1971-1976.
Grebinski et al., *Chem Mater.* 2004, 16, 5260-5272.
Jackson, *Classical Electrodynamics*, 1975, 75-78.
Jiang et al., *J. Phys Chem. B.* 2000, 104, 11936-11941.
Joselevich et al., *Nano Letters* 2002, 2, 1137-1141.
U.S. Appl. No. 10/638,546, filed Aug. 12, 2003, Kim et al.
U.S. Appl. No. 10/641,292, filed Aug. 15, 2003, Bawendi et al.
U.S. Appl. No. 60/403,367, filed Aug. 15, 2002, Bawendi et al.
Kuno, M., *Phys. Chem. Chem. Phys.* 2008, 10, 620-639.
Law et al., *Nature Mater.* 2005, 4, 455-459.
Lieber et al., *Sci. Amer.* 2001, 285, 58-64.
Martin, C. *Science* 1994, 266, 1961-1966.
Milliron et al., *Nature.* 2004, 430, 190-195.
Murray et al., *J. Am. Chem. Soc.* 115, 8706-8715.
Ouyang et al. *J. Am. Chem. Soc.* 2007, 129, 133-138.
Paffett et al., *J. Chem. Phys.* 1986, 85, 6176-6185.
Peng et al., *J. Am. Chem. Soc.* 2001, 123, 183-184.
Peng et al., *Nature*, 2000, 404, 59-61.
Protasenko et al., *Adv. Mater.* 2005, 17, 2942.
Singh et al., *Nano Letters* 2007, 7, 2999-3006.
Trentler et al., *Science* 1995, 270, 1791-1794.
Vayenas et al., *Nature* 1990, 343, 625-627.
Wagner, R.S. and W.C. Ellis, *Applied Physics Letters*, 1964. 4(5): p. 89-94.
Xu et al., *Pure and App. Chem.* 2000, 72, 127-135.
Yong et al., *Adv. Mater.* 2006, 18, 1978.
Yu et al., *J. Am. Chem. Soc.* 2003, 125, 16168-16169.
Zhang et al., *App. Phys. Lett.* 2001, 79, 3155-3157.

\* cited by examiner

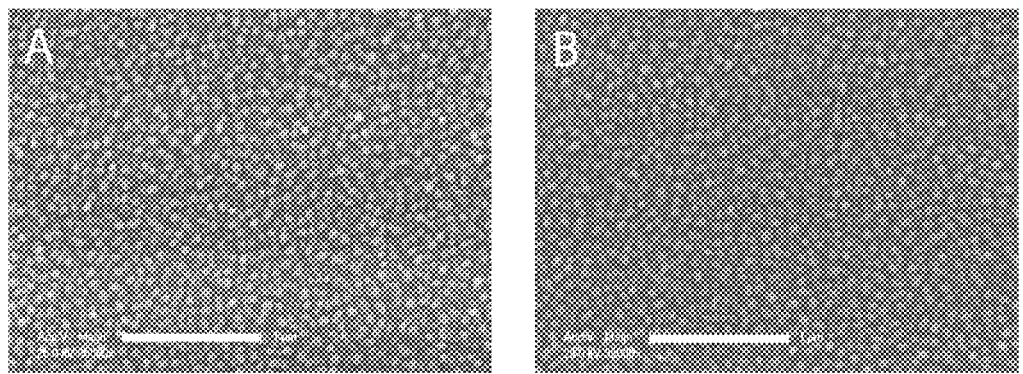
FIG. 6A-B

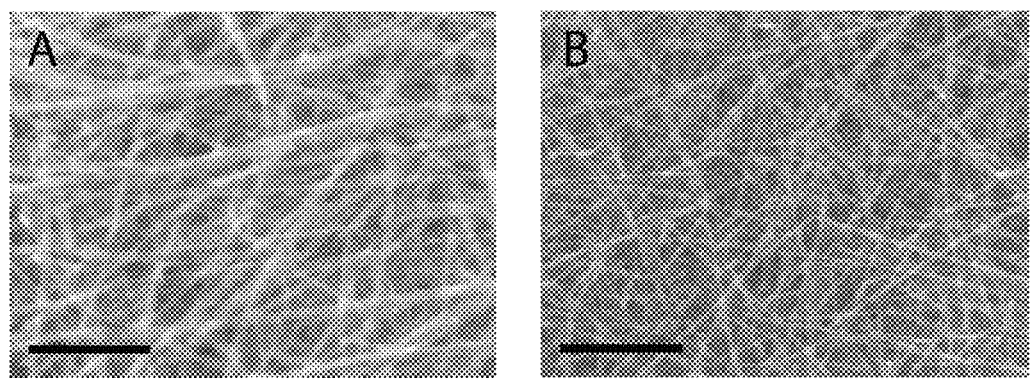
FIG. 7A-B

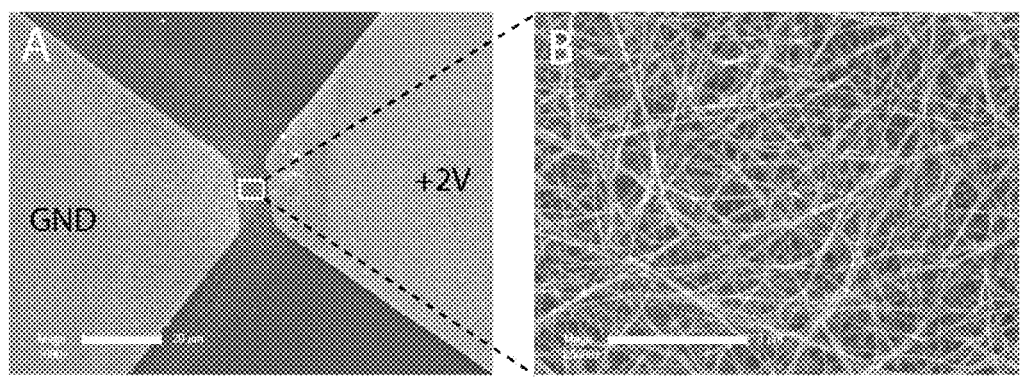
FIG. 8A-B

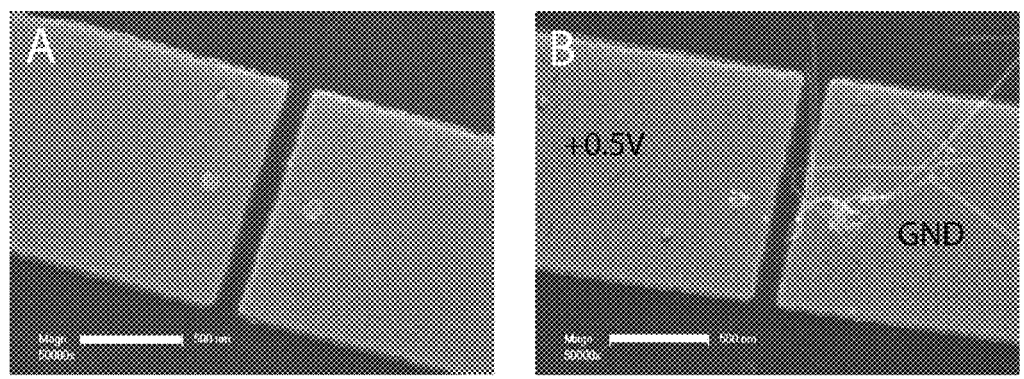
FIG. 9A-B

ELECTRICALLY CONTROLLED CATALYTIC NANOWIRE GROWTH BASED ON SURFACE CHARGE DENSITY

CLAIM OF PRIORITY

This application claims priority to U.S. Patent Application No. 61/119,158, filed on Dec. 2, 2008, which is hereby incorporated in its entirety.

FEDERALLY SPONSERED RESEARCH OR DEVELOPMENT

This invention was made with government support under grant number CHE0507147 awarded by the National Science Foundation. The government has certain rights in this invention.

TECHNICAL FIELD

The invention relates to nanowires and methods of producing nanowires.

BACKGROUND

Semiconductor nanowires can have the potential to not only reduce the size of microelectronic circuits but also can improve a wide variety of optoelectronic components. One method of synthesizing nanowires includes a low temperature method involving electrochemical deposition on porous templates followed by removal of the template material after growth, for example, by a vapor-liquid-solid phase (VLS) mechanism. In another example, a solution-liquid-solid (SLS) process can involve a reaction temperature which can be limited by the boiling point of the solvent/precursor mixture and catalyst particles that are active below this temperature.

SUMMARY

In general, a method of producing nanowires includes applying an electric field to a reactant solution at the surface of a catalyst under conditions that stimulate growth of the nanowire.

In one aspect, the method includes contacting two electrodes with a reactant solution, and applying an electric field across the two electrodes, at least one electrode including a catalyst. The two electrodes can be supported on a substrate, which can be glass, quartz, or silicon. At least one electrode includes platinum. Titanium or chromium can be added to the substrate to operate as an adhesion layer between the substrate and the electrode metal, for example, platinum.

The two electrodes can be facing electrodes separated by a gap. The gap can be greater than 10 nm, greater than 50 nm, greater than 100 nm, greater than 500 nm, greater than 1 micron, less than 1 cm, less than 5 mm, less than 1 mm, less than 500 microns, less than 250 microns, less than 100 microns or less than 50 microns (e.g., between 10 nm and 50 microns). The method can include altering a surface charge density of at least one electrode. Altering the surface charge density of at least one electrode can include increasing the negative surface charge density on the electrode having lower potential. The catalyst can include a seed particle. In certain circumstances, the catalyst can include bismuth (Bi). The method can include heating the reactant solution to a growth temperature between 200° C. and 400° C. Applying the electric field can include applying a voltage between 0V and 100V, greater than 1 mV, greater than 10 mV, greater than 100 mV, less than 50 V, less than 20 V, or less than 10 V, or other voltages suitable for the distance between the electrodes.

In another aspect, an apparatus for producing nanowire includes a reaction vessel, two electrodes positioned within the vessel, a catalyst on at least one electrode, a reactant solution delivery port configured to introduce a reactant solution into the vessel, and a voltage control device connected to the electrodes. The apparatus can include a heater configured to control the temperature of the reactant solution.

In another aspect, a device can include a nanowire produced by applying an electric field across the two electrodes in contact with a reactant solution.

In another aspect, a method of producing a device including a nanowire includes applying an electric field to a reaction solution to create a nanowire, and incorporating the nanowire in the device.

The nanowire can include a metal chalcogenide. The reactant solution can include a metal source and a chalcogenide source. The metal source can include cadmium. The metal source can be an metal containing salt, such as a halide, carboxylate, carbonate, hydroxide, or diketonate, in which M can be Cd, Zn, Mg, Hg, Al, Ga, In, or Tl. X can be O, S, Se, Te, N, P, As, or Sb. The chalcogenide source can include selenium. The chalcogenide source can include the elemental chalcogen, a phosphine chalcogenide, or a bis (silyl) chalcogenide.

The details of one or more embodiments are set forth in the accompanying drawings and the description below. Other features, objects, and advantages will be apparent from the description and drawings, and from the claims.

BRIEF DESCRIPTION OF DRAWINGS

FIGS. 6A and 6B are images depicting bismuth islands on a platinum electrode.

FIGS. 7A and 7B are images depicting CdSe wires grown off Bi layers with different thicknesses.

FIGS. 8A and 8B are images depicting CdSe wires grown on substrate with a conducting back gate.

FIGS. 9A and 9B are images depicting CdSe wires grown off single Bi beads.

DETAILED DESCRIPTION

Figure 1:
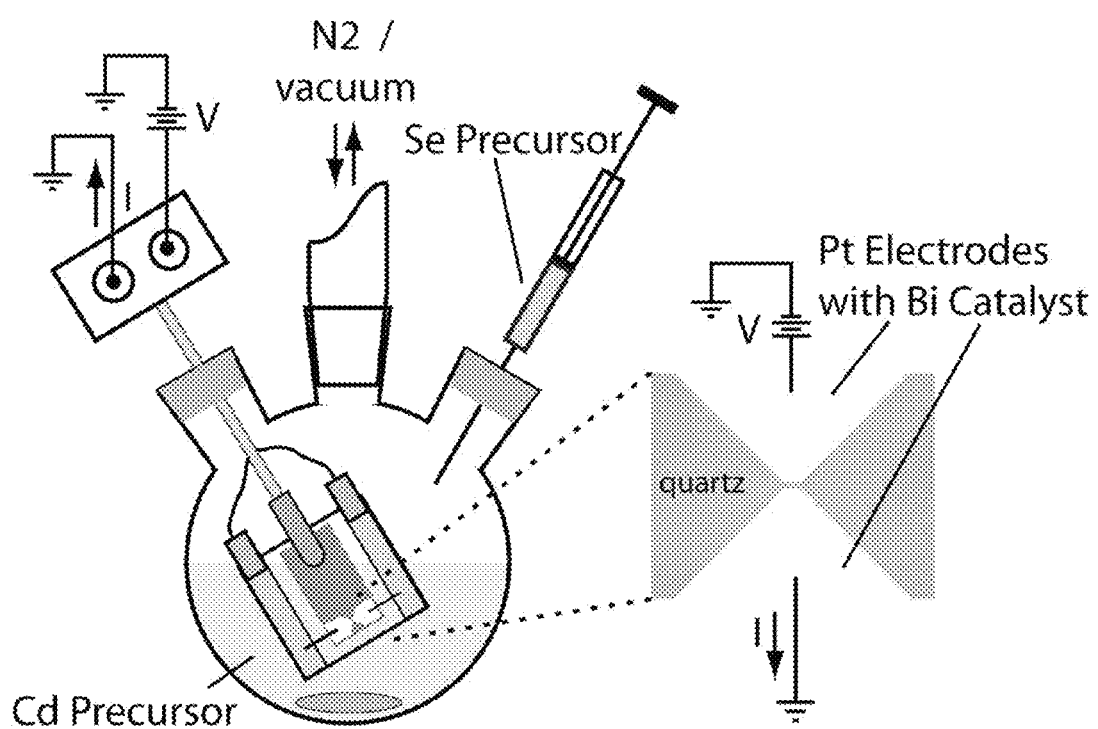
FIG. 1 is a schematic drawing depicting an apparatus for producing nanowires.

A method of producing nanowires can include applying an electric field proximate to a catalyst in contact with a reactant solution. The electric field can be created by a voltage drop applied over two or more electrodes. The voltage drop can be less than 20V, less than 18V, less than 15V, less than 10V, less than 9V, less than 6V, greater than 0V, greater than 100 mV, greater than 250 mV, greater than 500 mV, greater than 1V, greater than 1.5V, greater than 2V or greater than 3V.

The electrodes can be self supporting or can be supported on a substrate. For example, the electrodes can be metal layers deposited on the substrate, which can be glass, quartz or silicon, plastic or other inert, non-conductive solid. The electrodes are arranged on a surface of the substrate to create an electric field to drive growth of a nanowire. For example, the electrodes can be paired on a surface in a facing relationship. One electrode can have a growth region, which can form a gap with a second electrode. The gap can be configured to alter the surface charge density of at least one electrode, which can include increasing the negative surface charge density on the electrode having lower potential. The configuration can be arranged and modeled, for example, by finite element analysis, to create a surface charge density that controls and directs the growth of the nanowire. The gap can be less than 1 mm, less than 500 microns, less than 250 microns, less than 200 microns, less than 150 microns, less than 100 microns, greater than 1 nm, greater than 5 nm, greater than 10 nm, greater than 100 nm, greater than 200 nm, greater than 1 micron, greater than 50 microns, greater 250 microns, or greater than 500 microns, for example, between 10 nm and 50 microns.

The nanowire can be a semiconductor, for example, a metal chalcogenide or metal pnitcide. The nanowire can include Group II-VI compounds, Group II-V compounds, Group III-VI compounds, Group III-V compounds, Group IV-VI compounds, Group I-III-VI compounds, Group II-IV-VI compounds, Group IV compounds or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, Si, Ge, or mixtures thereof.

Each electrode can be a conductive material. The conductive material can include platinum, palladium, silver, gold, titanium, molybdenum, tungsten, zirconium, doped silicon, or combinations, alloys or layers thereof.

The catalyst can be a material configured to seed growth of a nanowire, for example, a seed particle or bead. The catalyst, seed particle or bead can include a metal or semiconductor, for example, bismuth or antimony. In certain circumstances, the catalyst can include bismuth and the semiconductor nanowire can include a metal chalcogenide, such as a II-VI semiconductor, for example, cadmium sulfide, cadmium selenide or cadmium telluride, or alloys thereof.

In general, the method of manufacturing the nanowire is a voltage-assisted modification of a colloidal growth process. See, for example, U.S. Pat. Nos. 6,322,901 and 6,576,291, each of which is incorporated by reference in its entirety. The voltage-assisted modification has the unexpected advantages of growing nanowires in a controlled and directional manner. Growth occurs by rapidly injecting a metal source, for example, an M-containing compound, and an X donor, or chalcogenide source into a solvent, which can be a hot coordinating solvent. Alternatively, it is possible to heat the reaction vessel already containing both the M-containing compound and X donor, making the injection step unnecessary. This can be particularly effective if the reaction conditions and reactants are chosen such that the reaction does not take place at the catalyst surface until a voltage is applied.

The coordinating solvent can include an amine. The M-containing compound can be a metal, an M-containing salt, or an M-containing organometallic compound. The nanowire grows at the surface of the catalyst, which can be grown in a controlled manner.

The reaction mixture can be gently heated to grow and anneal the nanowire. Both the average size and the size distribution of the nanowires in a sample can be dependent on the growth temperature. The growth temperature necessary to maintain steady growth increases with increasing average nanowire size. The nanowire can be a member of a population of nanowires. As a result of the discrete nucleation and controlled growth, the population of nanowires obtained has a narrow, monodisperse distribution of diameters.

While temperature and other reaction conditions. can play an important role in the growth of the nanowire, one of the most important parameters controlling the nanowire diameter is the size and size distribution of the catalyst, in particular, catalyst seed particles. As described herein, for example, the nominal thickness of the bismuth layer (which breaks up into droplets) impacts the diameter of the nanowire. The length of the nanowire can be adjusted or controlled, for example, by precursor concentration, growth time, voltage/electric field/surface charge density, and temperature.

The monodisperse distribution of diameters can also be referred to as a size. The process of controlled growth and annealing of the nanowires in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt can be a non-organometallic compound, e.g., a compound free of metal-carbon bonds. M is cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanowires to be manufactured under less rigorous conditions than corresponding metal alkyls.

Suitable M-containing salts can include cadmium acetylacetonate, cadmium iodide, cadmium bromide, cadmium chloride, cadmium hydroxide, cadmium carbonate, cadmium acetate, cadmium oxide, zinc acetylacetonate, zinc iodide, zinc bromide, zinc chloride, zinc hydroxide, zinc carbonate, zinc acetate, zinc oxide, magnesium acetylacetonate, magnesium iodide, magnesium bromide, magnesium chloride, magnesium hydroxide, magnesium carbonate, magnesium acetate, magnesium oxide, mercury acetylacetonate, mercury iodide, mercury bromide, mercury chloride, mercury hydroxide, mercury carbonate, mercury acetate, aluminum acetylacetonate, aluminum iodide, aluminum bromide, aluminum chloride, aluminum hydroxide, aluminum carbonate, aluminum acetate, gallium acetylacetonate, gallium iodide, gallium bromide, gallium chloride, gallium hydroxide, gallium carbonate, gallium acetate, indium acetylacetonate, indium iodide, indium bromide, indium chloride, indium hydroxide, indium carbonate, indium acetate, thallium acetylacetonate, thallium iodide, thallium bromide, thallium chloride, thallium hydroxide, thallium carbonate, or thallium acetate.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, -M- and —NR— where R is hydrogen, or $C_1$-$C_8$ alkyl or lower alkenyl.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for the nanowire production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanowire obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris(dimethylamino) arsine, an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

The nanowire manufactured from an M-containing salt grows in a controlled manner when the coordinating solvent includes an amine. The amine in the coordinating solvent can contribute to the quality of the nanowire obtained from the M-containing salt and X donor. Preferably, the coordinating solvent is a mixture of the amine and an alkyl phosphine oxide in a mole ratio of 10:90, more preferably 30:70 and most preferably 50:50. The combined solvent can decrease size dispersion and can improve photoluminescence quantum yield of the nanowire. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a nanowire, the photoluminescence quantum efficiency and the distribution of nanowire sizes can be improved in comparison to nanowire manufactured without the 1,2-diol or aldehyde or the amine.

The nanowire can include a core of a semiconductor material. The nanowire can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanowire can be a narrow Gaussian emission band that can be tuned through the complete wavelength range of the ultraviolet, visible, or infrared regions of the spectrum by varying the size of the nanowire, the composition of the nanowire, or both.

The quantum efficiency of emission from nanowire having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, charge carriers, i.e., electrons and holes, are confined in the core of the nanowire when in an excited state. Alternatively, the conduction band or valence band of overcoating material can have an energy intermediate between the energies of the conduction and valence bands of the core material. In this case, one carrier can be confined to the core while the other is confined to the overcoating material when in an excited state. See, for example, U.S. patent application Ser. No. 10/638,546, which is incorporated by reference in its entirety. The core can have an overcoating on a surface of the core. The overcoating can be a semiconductor material having a composition different from the composition of the core, and can have a band gap greater than the band gap of the core. The overcoat of a semiconductor material on a surface of the nanowire can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The outer surface of the nanowire can include a layer of compounds derived from the coordinating agent used during the growth process. The surface can be modified by repeated exposure to an excess of a competing coordinating group to form an overlayer. For example, a dispersion of the capped nanowire can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanowire, including, for example, phosphines, thiols, amines and phosphates. The nanowire can be exposed to short chain polymers which exhibit an affinity for the surface and which terminate in a moiety having an affinity for a suspension or dispersion medium. Such affinity improves the stability of the suspension and discourages flocculation of the nanowire.

Monodentate alkyl phosphines (and phosphine oxides; the term phosphine below will refer to both) can passivate nanowires efficiently. When nanowires with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanowire surface. In other words, they are stronger ligands, as is expected from the chelate effect of their polydentate characteristics.

Oligomeric phosphines have more than one binding site to the nanowire surface, which ensures their high affinity to the nanowire surface. See, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, tris(hydroxypropyl)phosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and $R^1$ has the formula

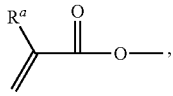

R' has the formula

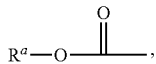

or R' is hydrogen, wherein $R^a$ is hydrogen or $C_1$-$C_4$ alkyl.

An overcoating process is described, for example, in U.S. Pat. No. 6,322,901, incorporated herein by reference in its entirety. By adjusting the temperature of the reaction mixture during overcoating and monitoring the absorption spectrum of the core, overcoated materials having high emission quantum efficiencies and narrow size distributions can be obtained. Alternatively, an overcoating can be formed by exposing a core nanowire having a first composition and first average diameter to a population of nanowires having a second composition and a second average diameter smaller than the first average diameter.

Size distribution during the growth stage of the reaction can be estimated by monitoring the absorption line widths of the wire. Modification of the reaction temperature in response to changes in the absorption spectrum of the particles allows the maintenance of a narrow wire size distribution during growth. Reactants can be added to the nucleation solution during wire growth to grow longer wires. By stopping growth at a particular nanowire average diameter, a population having an average nanowire diameter of less than 150 Å can be obtained. More generally, the fluorescence wavelength is determined by the wire diameter, which can primarily depend on the diameter of the catalyst seed particles.

A population of nanowires can have an average diameter of up to 1000 Å or higher. The emission spectra of the nanowires can be tuned continuously over the wavelength range of 300 nm to 5 microns, or for example, when CdSe or CdTe is the core material, from 400 nm to 800 nm. IR-emitting semiconductor nanowires can be prepared according to methods described in, for example, U.S. patent application Ser. No. 10/638,546, which is incorporated by reference in its entirety.

Another point of interest is the growth of nanowire heterostructures as described by Ouyang et al., e.g. CdSe wire, which changes its composition to CdS as the precursor in solution is changed. By using the methods described herein, the composition of the nanowire can be altered as it grows by altering the voltage driving the growth and the composition of the reactant solution.

The particle size distribution can be further refined by size selective precipitation with a poor solvent for the nanowires, such as methanol/butanol as described in U.S. Pat. No. 6,322,901, incorporated herein by reference in its entirety. For example, nanowires can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanowire population can have no more than a 15% rms deviation from mean diameter, preferably 10% rms deviation or less, and more preferably 5% rms deviation or less.

Transmission electron microscopy (TEM) can provide information about the size, shape, and distribution of the nanowire population. Powder X-ray diffraction (XRD) patterns can provide the most complete information regarding the type and quality of the crystal structure of the nanowires. High resolution TEM can enable one to see the crystal structure of individual nanowires at the nanoscale. In addition the crystal structure of single wires can be obtained by performing electron diffraction on sub micron areas. The elemental composition can be determined using STEM.

Estimates of size are also possible since particle diameter is inversely related, via the X-ray coherence length, to the peak width. For example, the diameter of the nanowire can be measured directly by transmission electron microscopy or estimated from X-ray diffraction data using, for example, the Scherrer equation. It also can be estimated from the UV/Vis absorption spectrum, if calibrated by a direct measurement of diameter, such as XRD or TEM.

The temperature can be greater than 150° C. or greater than 200° C. The temperature can be less than 400° C. or less than 350° C. The time can be less than 30 minutes, less than 20 minute, less than 15 minutes, less than 10 minutes, or less than 5 minutes.

An apparatus for producing nanowire can include a reaction vessel, two electrodes positioned within the vessel, a catalyst on at least one electrode, and a voltage control device connected to the electrodes. A reactant solution delivery port is configured to introduce a reactant solution into the vessel. The vessel is inert to the reactant mixture and can provide a temperature control of the solution, for example, via a heater configured to control the temperature of the reactant solution. The reactant solution delivery port can allow the reactant solution to be introduced into the vessel in a controlled environment (e.g., atmosphere, temperature, delivery rate, etc.). The electrodes are oriented to contact the reactant solution under controlled conditions (e.g., temperature, duration, etc.).

The nanowires produced by applying an electric field across the two electrodes in contact with a reactant solution can have advantageous properties or can be easily manufactured into devices, for example, by incorporating the nanowire in the device.

The nanowires can be suitable for a variety of applications, including those disclosed in U.S. Pat. Nos. 6,251,303, 6,326,144, and 6,617,583, each of which is incorporated herein by reference in its entirety. For example, the nanowires can be used in optoelectronic devices including electroluminescent devices such as light emitting diodes (LEDs), photovoltaics, alternating current thin film electroluminescent devices (ACTFELDs), or as large surface area electrodes for batteries and rechargeable cells.

Semiconductor nanowires have been under intense scientific investigation for their potential to reduce the size of microelectronic circuits and to improve a wide variety of optoelectronic components. See, for example, Lieber et al., *Sci. Amer.* 2001, 285, 58-64, Milliron et al., *Nature.* 2004, 430, 190-195, Law et al., *Nature Mater.* 2005, 4, 455-459, Singh et al., *Nano Letters* 2007, 7, 2999-3006, each of which has been incorporated by references in its entirety. Nanowire synthesis and device fabrication usually can be two separate steps, making nanowire placement and integration major issues. The method described herein can employ an electric field induced catalytic growth of semiconductor nanowires, for example, cadmium selenide nanowires, from solution. The strong influence of electric field and surface charge density on the wire growth process is surprising and unexpected and highlights the importance of each factor as tuning knobs that have, so far, largely been ignored. In addition, the method is compatible with conventional silicon based technology. For example, controlled, in-situ, integration of nanowires into functioning devices at growth temperatures below 300° C. can be achieved. The method can be extendable to a wide variety of other semiconductor materials and can aid in the development of organic/inorganic hybrid devices like, for example, excitonic solar cells. See, for example, Law et al., *Nature Mater.* 2005, 4, 455-459, Kuno, M., *Phys. Chem. Chem. Phys.* 2008, 10, 620-639, each of which has been incorporated by references in its entirety.

A low temperature method of growing nanowires can involve electrochemical deposition in porous templates followed by removal of the template material after growth. One route to nanowire synthesis is the vapor-liquid-solid phase (VLS) mechanism. See, for example, Martin, C. *Science* 1994, 266, 1961-1966, Xu et al., *Pure and App. Chem.* 2000, 72, 127-135, Wagner et al., *App. Phys. Lett.* 1970, 47-119, Trentler et al., *Science* 1995, 270, 1791-1794, each of which as been incorporated by references in its entirety. In this scheme, precursor gases in the vapor phase deliver the elements of the nanowire that is to be grown to a heated catalyst particle. When supersaturation of the precursor elements within the catalyst particle is reached, phase separation occurs and the nanowire begins to grow out of the catalyst seed. An analog process can take place in the solution phase and is commonly referred to as the solution-liquid-solid (SLS) process. In this case the reaction temperature is limited by the boiling point of the solvent/precursor mixture and catalyst particles that are active below this temperature are required. Well established methods for the wet chemical synthesis of monodisperse CdSe nanocrystals have recently been extended to yield high quality CdSe nanowires utilizing the SLS mechanism. See, for example, Trentler et al., *Science* 1995, 270, 1791-1794, Bulro et al., *Adv. Mater.* 1996, 8, 685-, Murray et al., *J. Am. Chem. Soc.* 115, 8706-8715, Peng et al., *Nature,* 2000, 404, 59-61, Peng et al., *J. Am. Chem. Soc.* 2001, 123, 183-184, Yu et al., *J. Am. Chem. Soc.* 2003, 125, 16168-16169, Grebinski et al., *Chem. Mater.* 2004, 16, 5260-5272, Yong et al., *Adv. Mater.* 2006, 18, 1978-, Ouyang et al. *J. Am. Chem. Soc.* 2007, 129, 133-138, each of which has been incorporated by references in its entirety. One aspect of this process that has largely been ignored is the impact of the electrochemical potential of the metal seed particles on the growth process. Below, the influence of voltage and electric field on CdSe nanowire growth off bismuth catalyst particles on platinum electrodes in solution, with the goal of in-situ device fabrication, is discussed.

Figure 5:
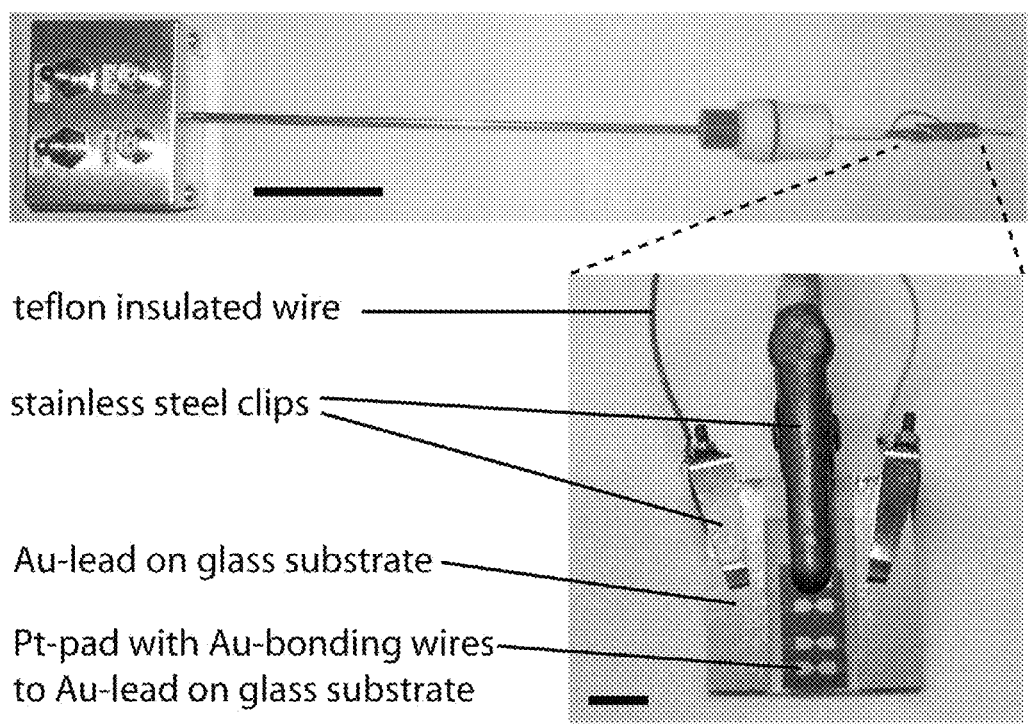
FIG. 5 is a schematic drawing depicting the substrate and electrode experimental setup.

Referring to FIGS. 1 and 5, the microstructured electrodes were immersed into a solution of cadmium precursors (cadmium oxide, tetradecylphosphonic acid (TDPA), and tri-octyl phosphine oxide (TOPO)) at 285° C., then a voltage was applied to the electrodes, typically between 0 and 5V, and the selenium precursor (tri-butyl phosphine selenide (TBP-Se)) was injected. After a growth period of 300 seconds the samples were withdrawn from the precursor solution and rinsed in hexanes. No additional treatments were performed prior to the photoluminescence and photoconductivity measurements described below. For analysis by transmission electron microscopy (TEM) the samples were sonicated in hexanes in order to detach the nanowires from the platinum electrodes. The resulting solution with the dispersed nanowires, was drop cast onto formvar coated copper grids (these grids are a very common commercial product specially designed for viewing micro and nanoscale objects in the TEM. They are very thin and can cause very little scattering/perturbation of the transmitted electron beam, so that the sample can be imaged clearly). The preparation of the precursors follows the description by Ouyang et al. *J. Am. Chem. Soc.* 2007, 129, 133-138, which is incorporated by reference in its entirety.

Referring to FIGS. 2A to D, nanowires only grow off the low potential (grounded) electrode and the amount of wire growth heavily depends on the applied voltage. Interestingly, no wire growth occurs at zero bias. This is in contrast to earlier observations of Bi seeded CdSe-nanowire growth in solution or on insulating and semiconducting substrates, where no voltages or electric fields are required to initiate nanowire growth. This behavior also differs from carbon nanotubes and silicon nanowires grown in AC and DC electric fields, where the primary effect of the electric field is to align the nanotubes or nanowires, rather than to promote or to inhibit the growth process itself. See, for example, Zhang et al., *App. Phys. Lett.* 2001, 79, 3155-3157, Chen et al., *App. Phys. Lett.* 2001, 78, 3714-3716, Avigal et al., *App. Phys. Lett.* 2001, 78, 2291-2293, Joselevich et al., *Nano Letters* 2002, 2, 1137-1141, Englander et al., *Nano Letters* 2005, 5, 705-708, each of which has been incorporated by references in its entirety.

Referring to FIG. 6, as on other substrates, bismuth also has a tendency to form droplets or islands when thermally deposited onto layers of platinum. The large difference in melting points between bismuth (271° C.) and platinum (1768° C.) should largely suppress alloying during bismuth deposition. However, some formation of the intermetallic compound BiPt at the bismuth-platinum interface can not be ruled out. Without being bound to any particular theory, it is believed that the work function difference between bismuth and platinum causes electrons to be drawn from the bismuth islands into the platinum electrode substrate, the resulting positive charging of the bismuth islands could be responsible for the inhibition of wire growth at zero bias and suggests that the uptake and reduction of cadmium is the growth limiting step. See, for example, Paffett et al., *J. Chem. Phys.* 1986, 85, 6176-6185, which has been incorporated by reference in its entirety. This hypothesis is supported by the fact that wire growth takes place on the low bias electrode, where the negative surface charge can compensate for the positive charging of the bismuth particles by the platinum electrode.

In conventional electro-deposition, the ionic electrolytes usually have very short screening lengths for electric fields, which leads to uniform material deposition on the electrodes. Here, the resistance of the precursor solution with the electrode geometry shown in FIG. 2A to D was typically between 100KΩ and 10MΩ during the entire nanowire growth process. The variations in background conductivity can probably be attributed to impurities in the precursor solutions. In contrast to electro-deposition, where the amount of deposited material is proportional to the amount of charge passed through the electrodes, nanowire growth was found to primarily be a function of electric field and the corresponding negative surface charge density on the low potential electrode.

Figure 2:
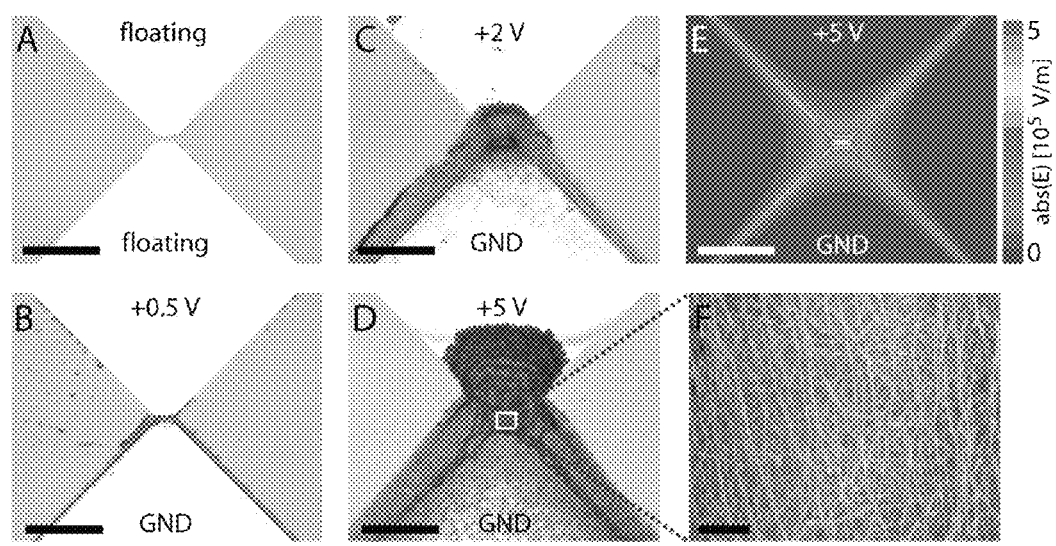
FIGS. 2A-D are images depicting voltage and electric field dependence of CdSe nanowire growth.
FIG. 2E is an image depicting the finite element simulation of the magnitude of the electric field in the substrate plane.
FIG. 2F is an image depicting the CdSe wire mat produced in FIG. 2D.

Referring to FIG. 2E, the simulations shown modeled the precursor solution as an insulator with a dielectric constant of 2.5 for TOPO. See, for example, Jiang et al., *J. Phys Chem. B.* 2000, 104, 11936-11941, which has been incorporated by reference in its entirety. As can be seen by comparing FIGS. 2B-D with E, the amount of nanowire growth on the grounded electrode is closely correlated with the electric field strength and the corresponding surface charge density on the grounded electrode. Owing to the symmetry of the geometry the absolute of the electric field is the same on both electrodes, however only the field pointing into the grounded electrode, that induces a negative surface charge, promotes nanowire growth. The electric field strength and hence charge density is sharply peaked at the electrode edges because of the well known effect of electric field bunching at the edges of thin metal sheets, as seen Jackson, *Classical Electrodynamics*, 1975, 75-78. For this reason nanowire growth is strongly enhanced and appears relatively constant along the electrode edges in FIGS. 2B-D.

Figure 3:
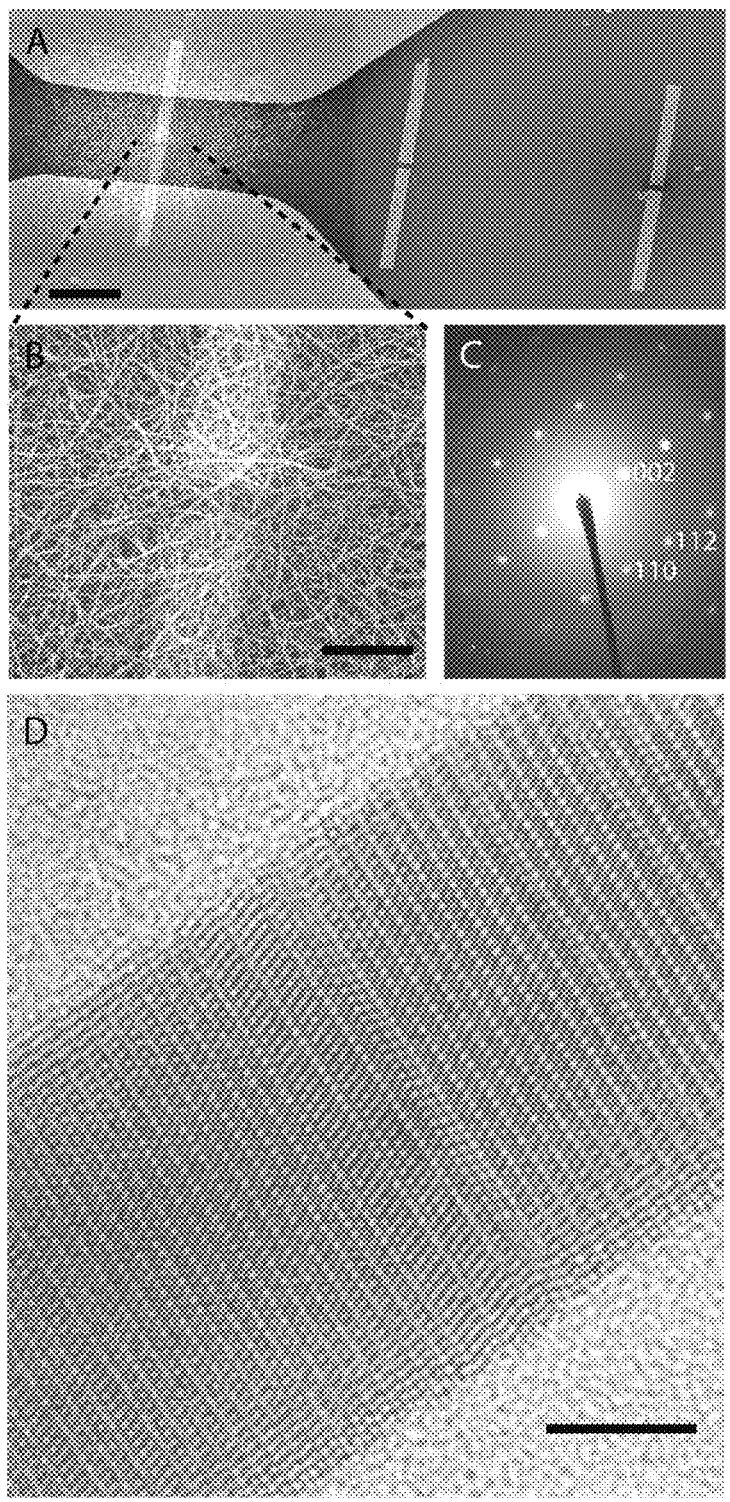
FIGS. 3A and 3B are images depicting the morphology and crystal structure of CdSe nanowires grown by methods described herein.
FIG. 3C is an electron diffraction pattern from a nanowire.
FIG. 3D is a high resolution TEM image of a nanowire.

Referring to FIG. 2F, the simulation shows that this effect described above can be quite pronounced. As can be seen in FIGS. 2B-D, nanowire growth is not only preferentially seeded at higher field regions on the electrode, but the macroscopic flow of wire material also appears to be field guided. On a microscopic scale as seen in FIG. 2E, in contrast, the individual wires form a random mat that appears to retain only a small amount of alignment with respect to the electric field vector. Wire growth off microstructured electrodes on a degenerately doped conducting silicon substrate with a 300 nm layer of insulating thermal oxide is shown in FIGS. 3A and B. Wire growth is weaker as a result of screening by the doped silicon back gate and emanates from the region of highest field close to the gap.

Referring to FIGS. 3C and D, cadmium selenide wires grown by this method are typically oriented along the wurtzite <001> direction and can show stacking faults and segments with zinc blende <111> orientation, as has been previously described in the literature. See, for example, Grebinski et al., *Chem. Mater.* 2004, 16, 5260-5272, Ouyang et al. *J. Amer. Chem. Soc.* 2007, 129, 133-138, each of which has been incorporated by references in its entirety.

Figure 4:
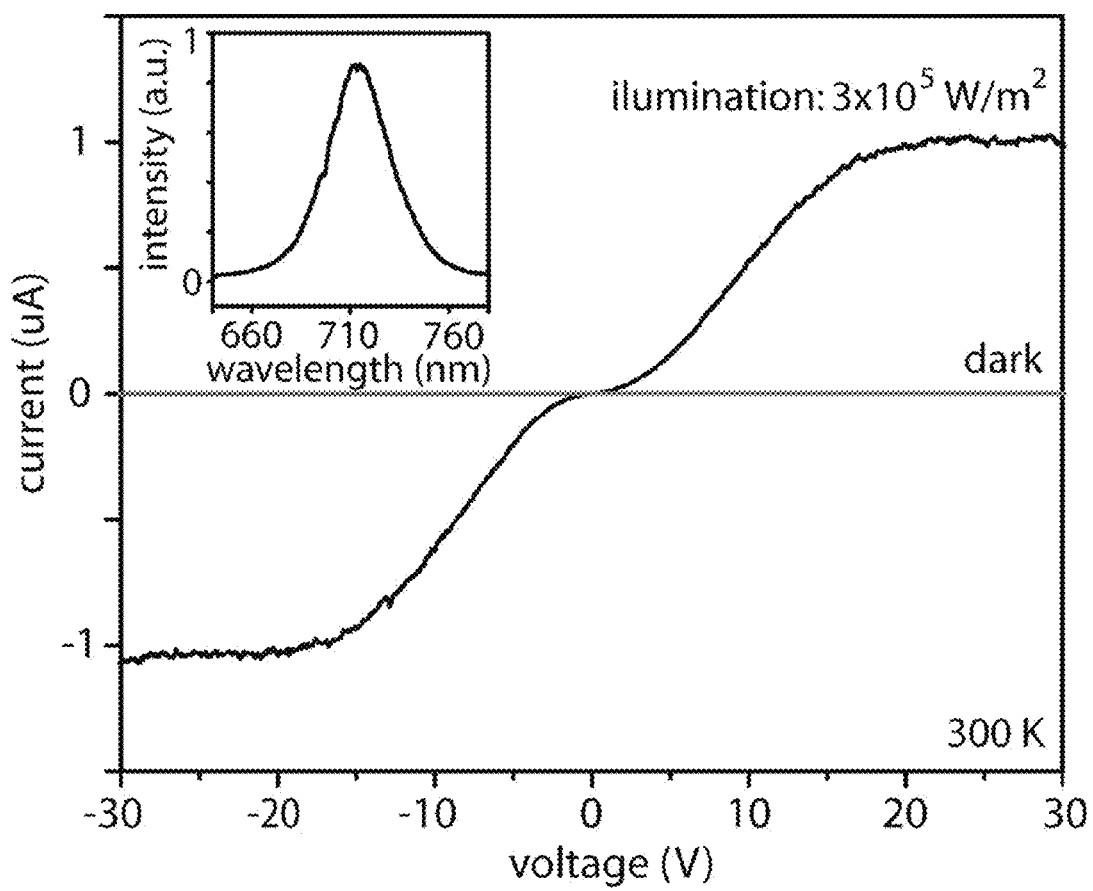
FIG. 4 is a graph of current voltage applied to a nanowire and the corresponding photoluminescence spectrum (inset).

Referring to FIG. 4, photoluminescence from mats of cadmium selenide nanowires seeded off 20 nm thick bismuth layers largely coincide with band gap emission from bulk cadmium selenide (1.74 eV or 713 nm). This is consistent with the typical nanowire diameters of ~20±10 nm that are about twice the exciton Bohr diameter of 11.2 nm in bulk cadmium selenide as seen in Yu et al., *J. Am. Chem. Soc.* 2003, 125, 16168-16169. The larger peak width as compared to typical samples of cadmium selenide nanocrystals is a well known phenomenon for cadmium selenide nanowires and can even be observed at the single wire level. Explanations include crystal phase mixtures within the wires, Stark shifts arising from local charge rearrangement, as well as chemical effects on the nanowire surface. See, for example, Protasenko et al., *Adv. Mater.* 2005, 17, 2942, which has been incorporated by reference in its entirety. Photoconductivity was measured by illuminating the wire mat bridging the 10 μm wide gap between the electrodes with the 514 nm line of an Ar-ion laser and measuring the corresponding current voltage characteristics. Photoconductivity could be observed in over 80% of the samples as taken from the growth solution and after rinsing in hexanes with no additional treatment. The IV-curves in the dark and under illumination are very symmetric, indicating that the nature of the nanowire/electrode contact is similar for the anode and cathode. The resistance in the dark was above 1TΩ (the resolution limit of the testing apparatus) yielding an on/off ratio of over $10^5$ at an illumination intensity of $3 \times 10^5$ W/m$^2$ near saturation. Saturation of the photocurrent sets in above approximately 15V, indicating that all excitons are field ionized. The photoluminescence as well as the photoconductivity show no polarization dependence in absorption or emission as expected from a predominantly random wire orientation at the micro scale, as can be seen in FIG. 2F. These results are consistent with reports by Singh et al. on similar CdSe nanowire devices fabricated by conventional techniques. See Singh, A., et al., *Polarization-sensitive nanowire photodetectors based on solution-synthesized CdSe quantum-wire solids*. Nano Letters, 2007. 7: p. 2999-3006, which is incorporated by reference in its entirety.

Referring to FIGS. 7-9, as highlighted with the in-situ fabrication of nanowire photodetectors, this technique could be a promising approach to the controlled integration of nanowires into optoelectronic devices and should be extendable to a wide variety of semiconductor systems. See, for example, Fanfair et al., *Crys. Growth & Des.* 2005, 5, 1971-1976, which has been incorporated by reference in its entirety. In addition, the relatively low growth temperatures below 300° C. make this process compatible with conventional silicon based technology. These observations point towards positive and negative charging of the bismuth catalyst particles as the cause for inhibition or promotion of nanowire growth, suggesting that the uptake and reduction of the cadmium precursor is the growth limiting mechanism. The effect reported here could also be related to the electrochemical enhancement of catalytic reactions reported previously in Vayenas et al., *Nature* 1990, 343, 625-627, which is incorporated by reference in its entirety. However, the systems studied so far appear to be markedly different from the one discussed above and a detailed microscopic understanding can lead to more theoretical modeling and in situ characterization of the precursor catalyst interface.

In summary, the nanowire growth utilizing the solution-liquid-solid mechanism can be strongly influenced by applying electronic excitations to the catalyst seed particles. By changing the applied voltage, the nanowire growth can be modulated. The method of growth of electrically conductive nanowires having electric field and surface charge density dependence could be a promising approach to the controlled integration of nanowires into optoelectronic devices and should be extendable to a wide variety of semiconductor systems. In addition, this method can be a powerful tool for controlled, in-situ, integration of nanowires into functioning devices at growth temperatures below 300° C. The arguments used to describe the growth process of nanowires can be applied generally.

EXAMPLES

A Cd precursor solution, the Cd source, was prepared by heating a suspension of 19.2 mg of Cd(OH)$_2$, 20 g of TOPO (trioctylphosphine oxide), and 85.6 mg of TDPA (1-tetradecylphosphonic acid in a four-necked flask to 140° C. under vacuum. After approximately 30 minutes, the solution was placed under 1 atm of nitrogen and heated to 300° C. over the course of 1 hour. The solution became optically clear upon formation of the Cd/TDPA complex, at which point the temperature was lowered to 285° C. The Se precursor solution was prepared by dissolving 25 wt % of selenium shot into tri-n-butylphosphine (TBP) overnight in a glove box under nitrogen atmosphere to form TBP-selenium.

The CdSe nanowire synthesis was done according to Ouyang et al., *J. Am. Chem. Soc.* 2007, 129, 133-138. The Bi-covered quartz substrate with microstructured electrodes was immersed into a cadmium precursor solution. Voltage, typically between 0 and 5V then was applied with a Yokogawa DC voltage source and 80 μl of the selenium precursor was injected into the Cd/TDPA TOPO solution from a different neck at which the substrate is located. After a growth period of typically 300 seconds substrate chips with the nanowire samples were withdrawn from the solution and the voltage was set back to 0V. The flask was cooled to below 150° C., and the sample was removed from the flask and rinsed with hexanes. The nanowire samples were then collected for photoluminescence and photoconductivity measurements.

Photoluminescence was measured by exciting the wires with the 514 nm line of an Ar-ion laser. The fluorescence was collected with an objective and analyzed with a grating spectrometer. Scattered laser light was removed with a 514 nm notch filter.

Photoconductivity was measured by illuminating the wire mat bridging the 10 μm wide gap between the electrodes with the 514 nm line of an Ar-ion laser measuring the corresponding current voltage characteristics. Samples were not prepared any further after the nanowires were washed with hexanes.

A number of embodiments have been described. Nevertheless, it will be understood that various modifications may be made without departing from the spirit and scope of the invention. For example, the methods and products described herein primarily related to methods of preparing cadmium selenide materials. However, it will be apparent to those skilled in the art that these methods can be extended to other nanowires, such as other semiconductors, including silicon and other metal chalcogenide and metal pnictide materials. Accordingly, other embodiments are within the scope of the following claims.

What is claimed is:

1. A method of producing metal-X nanowires comprising:
    immersing two electrodes into a reactant solution containing an organic molecule having an affinity for a surface of a nanowire;
    applying an electric field across the two electrodes, at least one electrode including a catalyst that includes bismuth or antimony;
    adding an X precursor to the reactant solution after applying the electric field; and
    heating the reactant solution with the X precursor while applying the electric field to a growth temperature between 200° C and 350° C to grow the nanowire,
    wherein a gap between the two electrodes is less than 1 mm.

2. The method of claim 1 wherein the two electrodes are supported on a substrate.

3. The method of claim 2, wherein the substrate includes glass, quartz, or silicon.

4. The method of claim 1, wherein the two electrodes are facing electrodes separated by a gap.

5. The method of claim 4, wherein the gap is between 10 nm and 100 microns.

6. The method of claim 1, wherein at least one electrode includes platinum and titanium.

7. The method of claim 1, wherein the catalyst includes a seed particle.

8. The method of claim 1, further comprising altering a surface charge density of at least one electrode.

9. The method of claim 8, wherein altering the surface charge density of at least one electrode includes increasing the negative surface charge density on the electrode having lower potential.

10. The method of claim 1, wherein applying the electric field includes applying a voltage between 0V and 10V.

11. The method of claim 1, wherein the nanowire is a metal chalcogenide.

12. The method of claim 11, wherein the reactant solution includes a metal source and a chalcogenide source.

13. The method of claim 12, wherein the metal source includes cadmium.

14. The method of claim 12, wherein the chalcogenide source includes selenium.

15. The method of claim 1, wherein the growth temperature is between 200° C and 300° C.

16. The method of claim 15, wherein the growth temperature is about 285° C.

17. The method of claim 1, wherein the gap is less than 250 microns.

18. The method of claim 1, wherein the gap is less than 100 microns.

19. The method of claim 1, wherein the gap is between 10 nm and 50 microns.

20. A method of producing a device including a metal-X nanowire comprising:
    applying an electric field across two electrodes, at least one electrode including a catalyst that includes bismuth or antimony, to a reaction solution to create a nanowire, wherein the reaction solution contains an organic molecule having an affinity for a surface of the nanowire and wherein the electrodes are immersed into the reaction solution;
    adding an X precursor to the reactant solution after applying the electric field;
    heating the reactant solution with the X precursor while applying the electric field to a growth temperature between 200° C and 350° C to grow the nanowire; and
    incorporating the nanowire in the device,
    wherein a gap between the two electrodes is less than 1 mm.

* * * * *